United States Patent [19]

Yakushiji et al.

[11] Patent Number: 5,030,581
[45] Date of Patent: Jul. 9, 1991

[54] METHOD OF FABRICATING A SEMICONDUCTOR APPARATUS

[75] Inventors: Shigenori Yakushiji, Yokohama; Kouji Jitsukata, Kawasaki, both of Japan

[73] Assignees: Kabushiki Kaisha Toshiba, Kawasaki; Toshiba Components Co., Ltd., Yokohama, both of Japan

[21] Appl. No.: 522,412

[22] Filed: Nov. 13, 1989

Related U.S. Application Data

[60] Division of Ser. No. 302,141, Jan. 27, 1989, abandoned, which is a continuation of Ser. No. 84,040, Aug. 11, 1987.

[30] Foreign Application Priority Data

Sep. 27, 1986 [JP] Japan .............................. 61-229154

[51] Int. Cl.$^5$ .......................................... H01L 21/265
[52] U.S. Cl. .......................................... 437/27; 437/6; 437/40; 437/913; 437/29
[58] Field of Search .................. 357/38, 90, 42, 23.12; 437/40, 913, 56, 6, 909, 34, 41, 27, 28, 29; 148/DIG. 9

[56] References Cited

U.S. PATENT DOCUMENTS

| | | | |
|---|---|---|---|
| 4,084,311 | 4/1978 | Yasuoka et al. | 437/34 |
| 4,205,342 | 5/1980 | Darwish et al. | 357/23 |
| 4,287,661 | 9/1981 | Stoffel | 437/913 |
| 4,306,916 | 12/1981 | Wollesen et al. | 437/27 |
| 4,713,329 | 12/1987 | Fang et al. | 437/27 |
| 4,783,424 | 11/1988 | Ohno et al. | 437/40 |

FOREIGN PATENT DOCUMENTS 0180484 8/1986 Japan .............................. 437/40

Primary Examiner—Brian E. Hearn
Assistant Examiner—Michael Trinh
Attorney, Agent, or Firm—Finnegan, Henderson, Farabow, Garrett, and Dunner

[57] ABSTRACT

A semiconductor apparatus comprises a semiconductor body of one conductivity type; a first impurity region of an opposite conductivity type, which is formed in the surface area of the semiconductor body; impurity regions of the opposite conductivity type, formed in the surface area of the semiconductor body, at locations away from the first impruity region; second and third impurity regions of one conductivity type, which seve as source and drain regions, respectively, and are formed in the impurity regions of an opposite conductivity type, so as to sandwich a channel reigon; and a gate electrode formed on the channel region, through an insulative layer. In this semiconductor apparatus, the impurity regions of the opposite conductivity type include fourth and fifth impurity regions, formed in the channel region such that at least parts of the fourth and fifth impurity regions overlap.

1 Claim, 4 Drawing Sheets

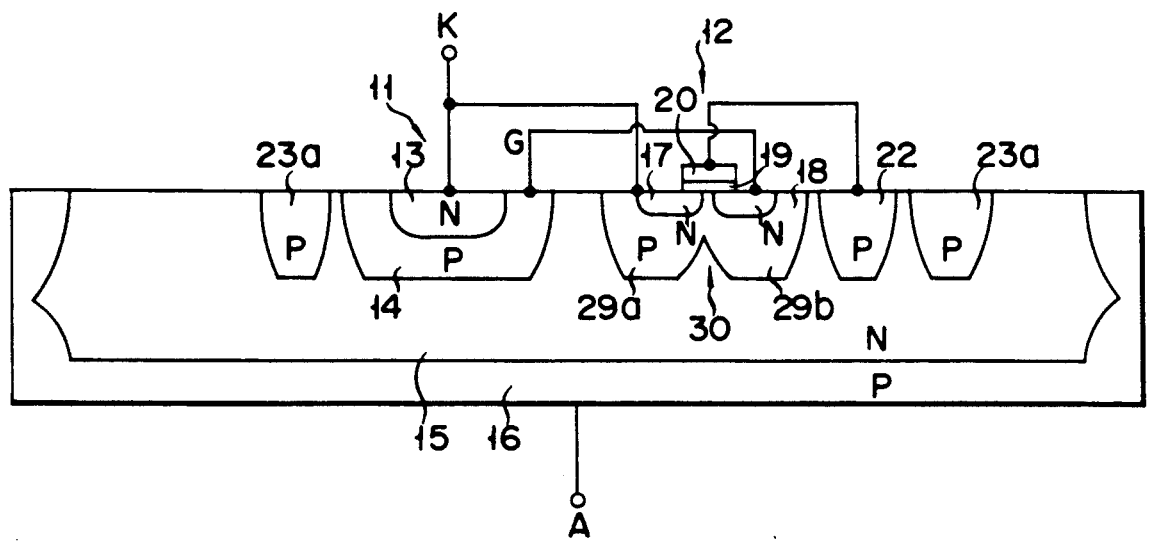
F I G. 3
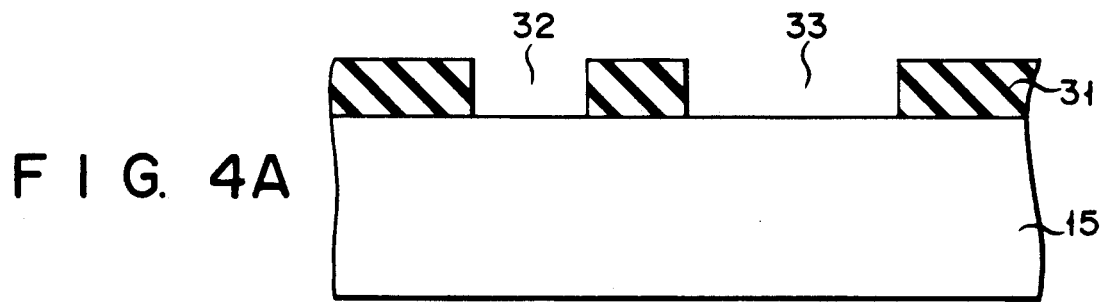
F I G. 4A
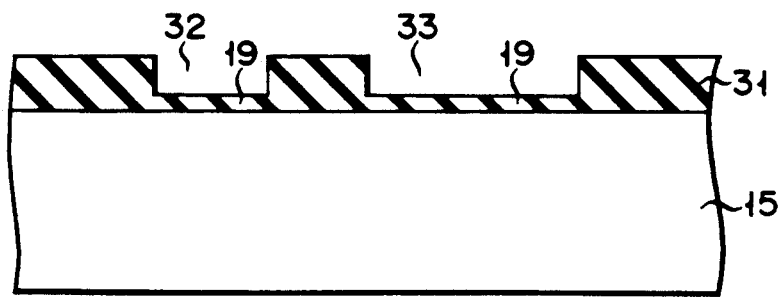
F I G. 4B

METHOD OF FABRICATING A SEMICONDUCTOR APPARATUS

This application is a division of application Ser. No. 07/302,141 filed Jan. 27, 1989, which is a continuation of Ser. No. 07/084,040 filed Aug. 11, 1987, both abandoned.

BACKGROUND OF THE INVENTION

The present invention relates to a semiconductor apparatus including an MOS structure and a semiconductor device having an impurity concentration higher than a channel region of the MOS structure, and also relates to a method of manufacturing such a semiconductor apparatus.

As disclosed in JP-A 60-74678, for example, a thyristor and a TRIAC in which an MOS structure is compounded have hitherto been known. FIG. 1 shows an example of the structure of a semiconductor apparatus including a thyristor having the MOS structure. In this case, the planar type is assumed. The semiconductor apparatus shown in FIG. 1 includes thyristor 11 and MOS transistor 12 for short-circuiting gate G and cathode K of thyristor 11. Thyristor 11 comprises: N-type emitter region 13; a P-type base region 14; N-type base region 15; and P-type emitter region 16. On the other hand, MOS transistor 12 comprises: N-type source region 17; N-type drain region 18; gate insulative film 19; and gate electrode 20. MOS transistor 12 is formed in P-type well region 21. P-type well region 22, for driving the gate of MOS transistor 12, is surrounded by guard ring 23a.

To obtain the desired characteristics in the foregoing constitution, the surface impurity concentration of P-type base region 14 of thyristor 11 must be set to approx. $2 \times 10^{17}$ cm$^{-3}$, and the surface impurity concentration of P-type well region 21, in which MOS transistor 12 is formed, must be set to approx. $5 \times 10^{16}$ cm$^{-3}$. Thus, it is necessary to form P-type regions 14 and 21 having surface impurity concentrations different from each other, and the impurities must be implanted and diffused into each of these regions in different steps. Therefore, as can be clearly seen, there are drawbacks to the present method of manufacturing this type of semiconductor device, such as the increased complexing of the manufacturing process, along with the inevitable increase in manufacturing cost and the reduction in yield.

FIGS. 2A to 2G show several of the steps involved in the manufacture of a thyristor including an MOS structure with much attention to the formation of P-type regions 14 and 21. First, as is shown in FIG. 2A, in relatively thick oxide film 24 formed on N-type base region 15, the portion corresponding to the region where P-type base region 14 will be formed is etched to thereby form opening 25. Next, as is shown in FIG. 2B, buffer oxide film 26 whose thickness is about 1000 Å is formed on N-type base region 15 exposed in opening 25. Then, P-type impurities are ion implanted into base region 15, through oxide film 26, to a predetermined concentration. Thereafter, a heat treatment is performed, and the P-type impurities are annealed and diffused, thereby forming P-type impurity layer 14A serving as P-type base region 14, as shown in FIG. 2C.

Next, as is shown in FIG. 2D, the portion corresponding to oxide film 24, on the region where P-type well region 21 of MOS transistor 12 will be formed, is etched to thereby form opening 27. Buffer oxide film 28 is formed on the exposed surface of N-type base region 15 in opening 27. After buffer oxide film 28 has been formed there, buffer oxide film 26 grows thickly. P-type impurities are implanted into base region 15 through only buffer oxide film 28. The dose amount at this time is set to a value lower than that used in formation of P-type impurity layer 14A. Next, a heat treatment is performed to diffuse and anneal the P-type impurities. As a result, as is shown in FIG. 2E, the impurities in P-type impurity layer 14A are deeply diffused and P-type impurity layer 14A serves as P-type base region 14. After this, P-type well region 21 is formed.

After buffer oxide film 28 has been removed (this film may be left and used as a gate oxide film without removing), as is shown in FIG. 2F, gate oxide film 19 is formed, with gate electrode 20 being formed thereon. Thereafter, N-type impurities are ion implanted, using gate electrode 20 and oxide film 24 as masks, after which annealing and diffusing are performed. As a result, as can be seen in FIG. 2G, source region 17 and drain region 18 are formed in P-well type region 21.

The foregoing manufacturing method does, however, have drawbacks, such as that the manufacturing steps are complicated and the overall manufacturing process, therefore, time-consuming, and that it is difficult to control the surface impurity concentrations, diffusion depths, and the like of P-type base region 14 and P-type well region 21.

SUMMARY OF THE INVENTION

It is an object of the present invention to provide a semiconductor apparatus in which an active region having a low surface impurity concentration and an active region having a high surface impurity concentration can be formed simultaneously, so as to respectively have desired impurity concentrations, and to provide a method of manufacturing such a semiconductor apparatus.

This object is accomplished by a semiconductor apparatus comprising: a semiconductor body of one conductivity type; a first impurity region of an opposite conductivity type, which is formed in the surface area of the semiconductor body; second and third impurity regions of an opposite conductivity type, formed in the surface area of the semiconductor body at positions away from the first impurity region, so that parts of the second and third impurity regions overlap; fourth and fifth impurity regions of one conductivity type, which serve as source and drain regions and are formed so as to sandwich a channel region including at least a part of the overlap portion of the second and third impurity regions; and a gate electrode formed on the channel region, through an insulative layer.

In this semiconductor apparatus, the channel region of the MOS device is formed by a coupling portion having an impurity concentration lower than those of the central regions of the second and third impurity regions. Therefore, even if the second and third impurity regions and the first impurity region are formed simultaneously, the impurity concentration of the channel region can be set to a value lower than those of the active regions of the second and third impurity regions.

Alternatively, the above object is accomplished by a method of manufacturing a semiconductor apparatus comprising the steps of: forming an insulative layer on a semiconductor body of one conductivity type; forming first and second opening portions at locations away from each other on the insulative layer; forming an insulative film, which is thinner than the insulative layer, on the semiconductor body exposed in the first and second opening portions; forming a gate electrode on the insulative film in the second opening portion; forming a first impurity region in the portion corresponding to the first opening portion, by implanting impurities of an opposite conductivity type into the semiconductor body through the first and second opening portions, by use of the insulative layer and the gate electrode as masks, and forming second and third impurity regions in the portion corresponding to the second opening portion, so that parts of the second and third impurity regions overlap; and forming fourth and fifth impurity regions serving as a source and a drain, respectively by implanting impurities of one conductivity type in the second and third impurity regions, through the second opening portion.

According to a manufacturing method of the semiconductor apparatus embodying the present invention, the channel region of the MOS device is formed by a coupling portion of the second and third impurity regions, which are formed by the same step in which the first impurity region is formed. Therefore, the channel region having an impurity concentration lower than the active region of the first impurity region can be formed simultaneous with the formation of the first impurity region.

BRIEF DESCRIPTION OF THE DRAWINGS

FIG. 3 relates to an embodiment of the present invention and shows a cross-sectional structure of a semiconductor apparatus having a P-type base region and a P-channel region; and FIGS. 4A to 4F show several of the steps involved in the manufacture of the semiconductor apparatus shown in FIG. 3.

DETAILED DESCRIPTION OF THE PREFERRED EMBODIMENT

Figure 1:
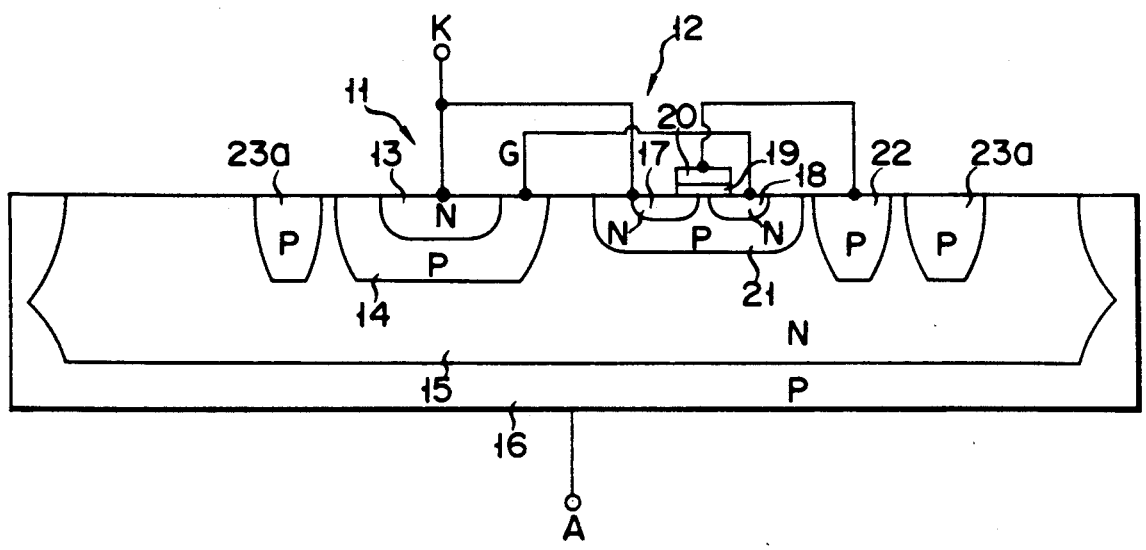
FIG. 1 shows a cross-sectional structure of a conventional semiconductor apparatus having a P-type base region and a P-channel region.
Figure 2A:
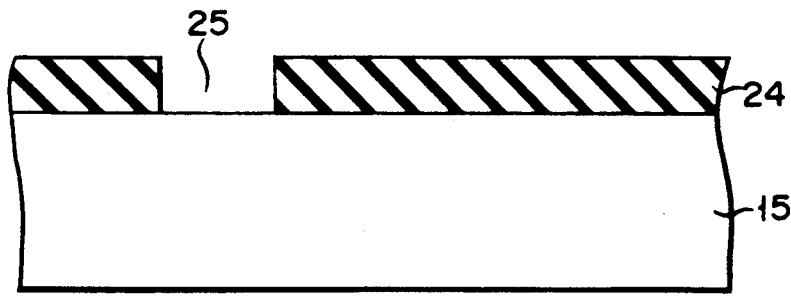
FIGS. 2A to 2G show several of the steps involved in the manufacture of the semiconductor apparatus shown in FIG. 1.
Figure 2B:
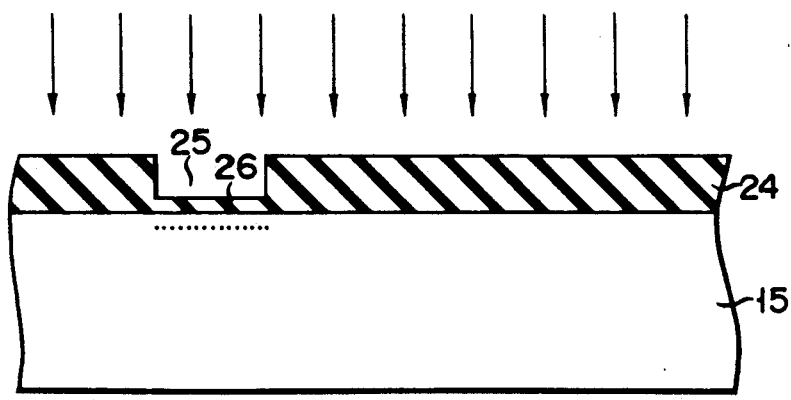
Figure 2C:
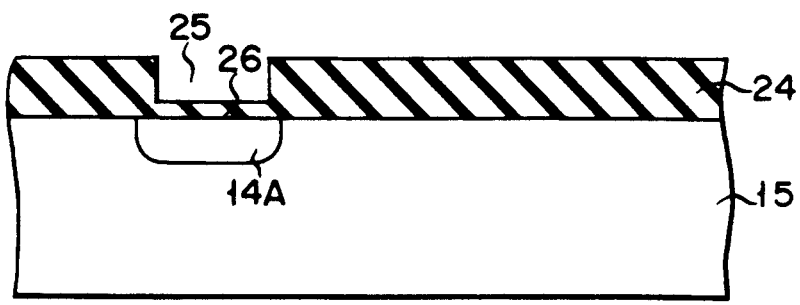
Figure 2D:
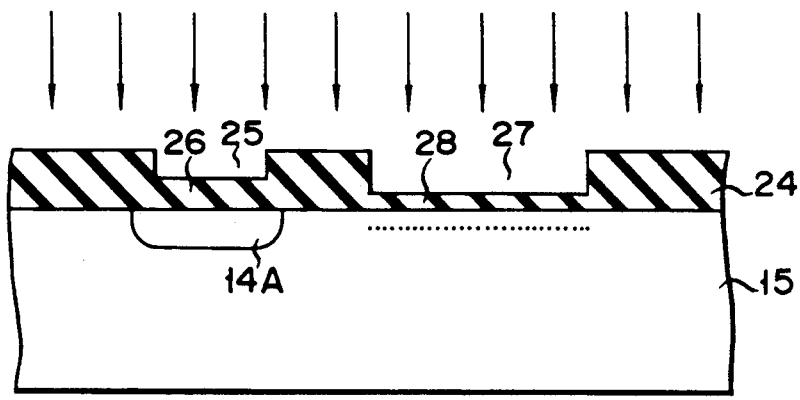
Figure 2E:
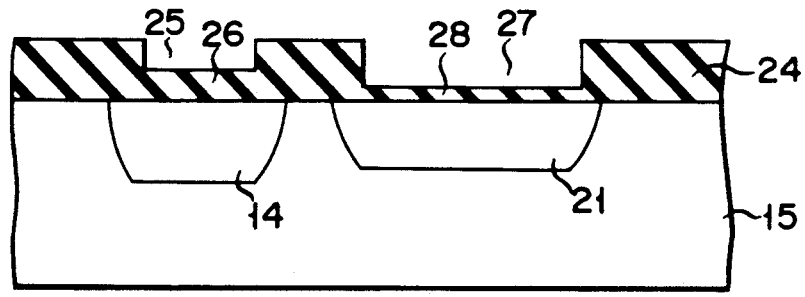
Figure 2F:
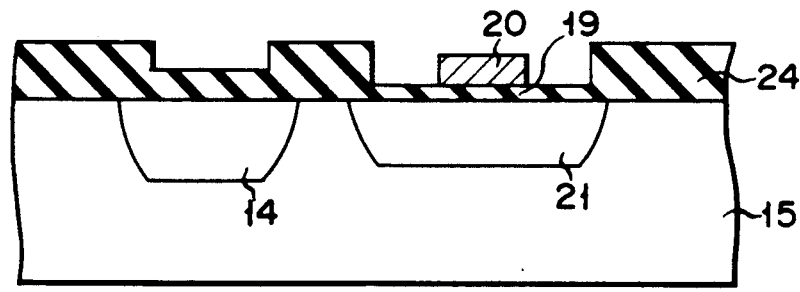
Figure 2G:
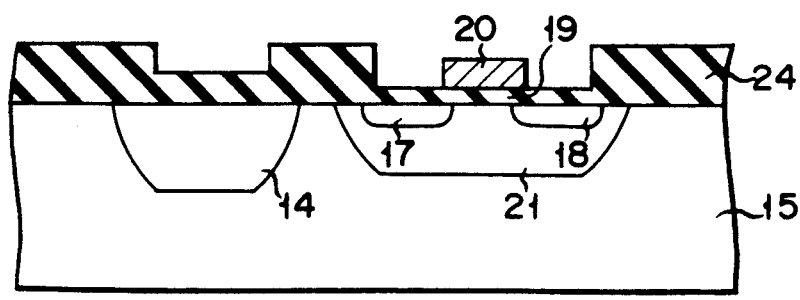

FIG. 3 shows a cross sectional structure of a semiconductor apparatus according to an embodiment of the present invention. FIGS. 4A to 4F show a part of the manufacturing steps of a thyristor including the MOS structure in which two P-type active regions having different surface impurity concentrations are formed by the same step. In FIG. 3, the same parts and components as those shown in FIG. 1 are designated by the same reference numerals. The constitution of FIG. 3 is similar to that of FIG. 1 except for the P-type well region which forms MOS transistor 12. Namely, in FIG. 3, P-type well region 30 is formed by connecting two P-type impurity diffusion regions 29a and 29b by diffusing them in the horizontal direction.

Figure 4C:
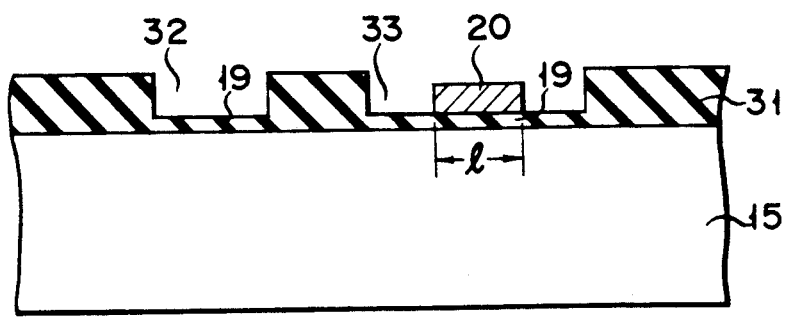
Figure 4D:
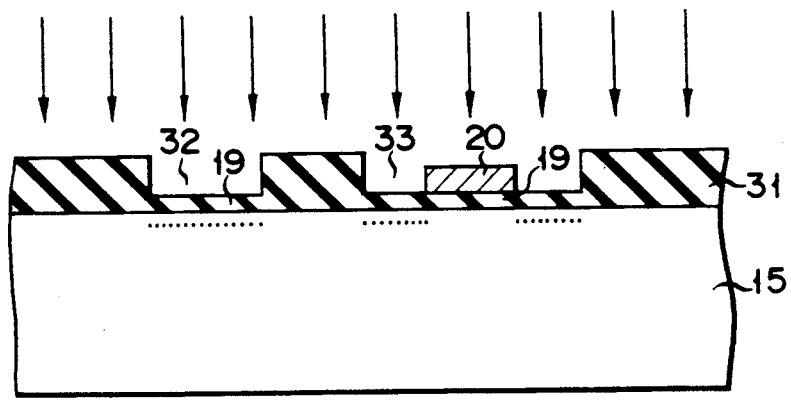
Figure 4E:
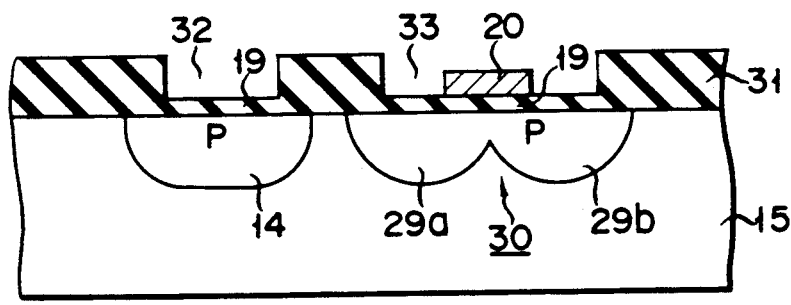
Figure 4F:
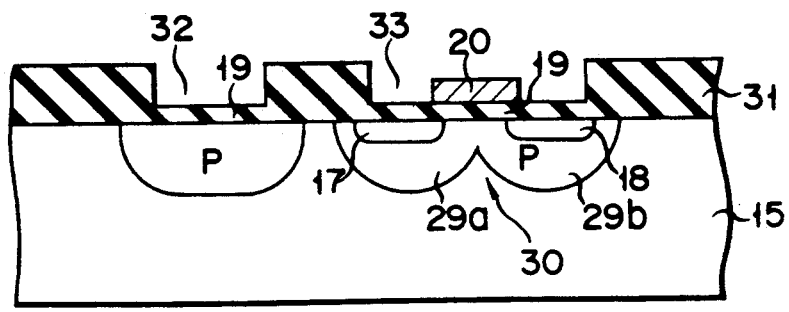

A part of the manufacturing steps of the semiconductor apparatus including P-type base region 14 and P-type well region 30 having different surface impurity concentrations will now be described with reference to FIGS. 4A to 4F. First, as shown in FIG. 4A, relatively thick oxide film 31 is formed on N-type base region 15. The regions where P-type base region 14 and P-type well region 30 will be formed are etched to thereby form openings 32 and 33. Thereafter, as shown in FIG. 4B, gate oxide film 19 having a thickness of about 1000 Å is formed on N-type base region 15 exposed in openings 32 and 33. Next, as shown in FIG. 4C, gate electrode (polysilicon gate) 20 having a length l (l is set to a value not larger than the value which is twice as long as diffusion length $x_j$ in the horizontal direction after the diffusion of the P-type impurity region; for example, $l \leq 2x_j$) is formed on gate oxide film 19 on the region where P-type well region 30 will be formed. Then, as shown in FIG. 4D, P-type impurities are ion implanted. At this time, surface impurity concentration $Q_d$ was set to $1 \times 10^{14}$ cm$^{-2}$ and accelerating voltage V was set to 50 keV. Next, the heat treatment is performed to anneal and diffuse the ion implanted P-type impurities. Thus, as shown in FIG. 4E, P-type impurity regions 14, 29a, and 29b are formed. Regions 29a and 29b are connected by the diffusion in the horizontal direction and P-type well region 30 is formed. When the diffusion was performed until $x_j = 20$ μ, the surface impurity concentration of P-type base region 14 in thyristor 11 was $2 \times 10^{17}$ cm$^{-3}$ and the surface impurity concentration of P-type well region 30 forming MOS transistor 12 was $6 \times 10^{16}$ cm$^{-3}$ at the lowest position (at the middle point of gate electrode 20). Next, as shown in FIG. 4F, N-type impurities are selectively ion implanted into the region where MOS transistor 12 will be formed by use of gate electrode 20 as a mask. Then, the annealing and diffusion are performed to thereby form source region 17 and drain region 18.

It has been confirmed that the characteristics of sole MOS transistor 12 formed by the foregoing steps can be controlled by the channel length and the length l of gate electrode and when this manufacturing method is applied to production of the thyristor including the MOS structure therein, the thyristor can correctly operate.

According to such a manufacturing method, two diffusion layers having different surface impurity concentrations can be formed by a single impurity implanting and diffusing step, so that the manufacturing steps can be simplified and the cost can be reduced. In addition, since the implantation and diffusion of impurities can be performed by only a single step, a concentration of impurities and a depth of diffusion thereof can be easily controlled.

Although polysilicon gate 20 has been used as a mask when the P-type impurities are ion implanted in the foregoing embodiment, it is also possible to form a thick oxide film on the channel and to use this thick oxide film as a mask. On the other hand, although an example of formation of the N-channel type MOS transistor has been described above, a P-channel type MOS transistor can be also formed in a manner similar to the above. Further, in the step of FIG. 4D, impurity regions can be formed in substrate 15 by a diffusion process after selectively etching out corresponding portions of oxidation films 19.

What is claimed is:

1. A method of manufacturing a semiconductor apparatus, comprising the steps of:

forming an insulative layer on a semiconductor body of one conductivity type;

forming first and second opening portions on said insulative layer, such that said portions are located away from each other;

forming an insulative film thinner than said insulative layer on said semiconductor base material exposed in said first and second opening portions;

forming a gate electrode on the insulative film in said second opening portion;

forming a first impurity region in the portion corresponding to said first opening portion, by implanting impurities of an opposite conductivity type in said semiconductor base material, through said first and second opening portions, by using said insulative layer and said gate electrode as masks, and forming second and third impurity regions in the portion corresponding to said second opening portion, so that parts of said second and third impurity regions overlap; and forming fourth and fifth impurity regions, serving as a source and a drain, respectively, by implanting impurities of one conductivity type into said second and third impurity regions, through the second opening portion.

* * * * *